United States Patent [19]
Chen et al.

[11] Patent Number: 5,989,623
[45] Date of Patent: Nov. 23, 1999

[54] DUAL DAMASCENE METALLIZATION

[75] Inventors: Liang-Yuh Chen; Rong Tao, both of San Jose; Ted Guo, Palo Alto; Roderick Craig Mosely, Pleasanton, all of Calif.

[73] Assignee: Applied Materials, Inc., Santa Clara, Calif.

[21] Appl. No.: 08/914,521

[22] Filed: Aug. 19, 1997

[51] Int. Cl.⁶ ...................................................... B05D 5/12
[52] U.S. Cl. ................................. 427/97; 427/123; 427/96
[58] Field of Search ................................. 427/123, 96, 97

[56] References Cited

U.S. PATENT DOCUMENTS

| | | |
|---|---|---|
| 4,920,072 | 4/1990 | Keller et al. . |
| 4,920,073 | 4/1990 | Wei et al. . |
| 4,938,996 | 7/1990 | Ziv et al. . |
| 4,960,732 | 10/1990 | Dixit et al. . |
| 4,985,750 | 1/1991 | Hoshino . |
| 4,994,410 | 2/1991 | Sun et al. . |
| 5,010,032 | 4/1991 | Tang et al. . |
| 5,081,064 | 1/1992 | Inoue et al. . |
| 5,091,339 | 2/1992 | Carey . |
| 5,250,465 | 10/1993 | Iizuka et al. . |
| 5,292,558 | 3/1994 | Heller et al. . |
| 5,354,712 | 10/1994 | Ho et al. . |
| 5,439,731 | 8/1995 | Li et al. . |
| 5,480,836 | 1/1996 | Harada et al. . |
| 5,585,673 | 12/1996 | Joshi et al. . |
| 5,595,937 | 1/1997 | Mikagi ..................................... 437/192 |
| 5,693,563 | 12/1997 | Teong ...................................... 437/190 |
| 5,739,579 | 4/1998 | Chiang et al. ........................... 257/635 |
| 5,814,557 | 9/1998 | Venkatraman et al. .................. 438/622 |
| 5,824,599 | 10/1998 | Schacham-Diamand et al. ..... 438/678 |
| 5,858,873 | 1/1999 | Vitkavage et al. ....................... 438/626 |

FOREIGN PATENT DOCUMENTS

| | | |
|---|---|---|
| 0 558 004 A2 | 9/1993 | European Pat. Off. . |
| 0 776 037 A2 | 5/1997 | European Pat. Off. . |
| 63-9925 | of 0000 | Japan . |
| 8-10693 | 1/1996 | Japan . |
| 08181141 | 7/1996 | Japan . |
| WO 98/27585 | 6/1998 | WIPO . |

OTHER PUBLICATIONS

K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," 1996 IEEE, pp. 365–368.

Electromigration and Diffusion in Pure Cu and Cu(Sn) Alloys, C.–K. Hu, K. L. Lee, D. Gupta, and P. Blauner, Mat. Res. Soc. Symp. vol. 427, (96–105).

Electromigration Failure Distributions for Multi–Large Interconnects as a Function of Line Width: Experiments and Simulation, D.D. Brown, J.E. Sanchez, Jr., V. Pham, P.R. Besser, M.A. Korhonen, and C.–Y. Li. Mat. Res. Soc. Symp. vol. 427.

European International Search Report Dated Nov. 5, 1998.

*Primary Examiner*—Shrive Beck
*Assistant Examiner*—Paul D. Strain
*Attorney, Agent, or Firm*—Thomason, Moser & Patterson

[57] ABSTRACT

The present invention generally provides a metallization process for forming a highly integrated interconnect. More particularly, the present invention provides a dual damascene interconnect module that incorporates a barrier layer deposited on all exposed surface of a dielectric layer which contains a dual damascene via and wire definition. A conductive metal is deposited on the barrier layer using two or more deposition methods to fill the via and wire definition prior to planarization. The invention provides the advantages of having copper wires with lower resistivity (greater conductivity) and greater electromigration resistance than aluminum, a barrier layer between the copper wire and the surrounding dielectric material, void-free, sub-half micron selective CVD Al via plugs, and a reduced number of process steps to achieve such integration.

26 Claims, 7 Drawing Sheets

FIG. 7

DUAL DAMASCENE METALLIZATION

BACKGROUND OF THE INVENTION

1. Field of the Invention

The present invention relates to a metallization method for manufacturing semiconductor devices. More particularly, the present invention relates to metallization of dual damascene via and wire definitions in a dielectric layer to form metal interconnects and metal via plugs.

2. Background of the Related Art

Sub-half micron multilevel metallization is one of the key technologies for the next generation of very large scale integration (VLSI). The multilevel interconnects that lie at the heart of this technology require planarization of interconnect features formed in high aspect ratio apertures, including contacts, vias, lines or other features. Reliable formation of these interconnect features is very important to the success of VLSI and to the continued effort to increase circuit density and quality on individual substrates and die.

As circuit densities increase, the widths of vias, contacts and other features, as well as the dielectric materials between them, must decrease resulting in larger aspect ratios for the features. Therefore, there is a great amount of ongoing effort being directed at the formation of void-free features having high aspect ratios wherein the ratio of feature width to feature height is 4:1 or larger. One such method involves selective chemical vapor deposition (CVD) of material only on exposed nucleation surfaces as provided on the substrate surface. Selective CVD involves the deposition of a film layer upon contact of a component of the chemical vapor with a conductive substrate. The component nucleates on such substrate creating a metal surface on which further deposition proceeds.

Selective CVD metal deposition is based on the fact that the decomposition of a CVD metal precursor gas usually requires a source of electrons from a conductive nucleation film. In accordance with a conventional selective CVD metal deposition process, the metal should grow in the bottom of an aperture where either a metal film or doped silicon or metal silicide from the underlying conductive layer has been exposed, but should not grow on dielectric surfaces such as the field and aperture walls. The underlying metal films or doped silicon are electrically conductive, unlike the dielectric field and aperture walls, and supply the electrons needed for decomposition of the metal precursor gas and the resulting deposition of the metal. The result obtained through selective deposition is an epitaxial "bottom-up" growth of CVD metal in the apertures capable of filling very small dimension (<0.25 μm), high aspect ratio (>5:1) via or contact openings.

Elemental aluminum (Al) and its alloys have been the traditional metals used to form lines and plugs in semiconductor processing because of aluminum's low resistivity, superior adhesion to silicon dioxide ($SiO_2$), ease of patterning, and high purity. Furthermore, aluminum precursor gases are available which facilitate the selective CVD process described above. However, aluminum has higher resistivity and problems with electromigration. Electromigration is a phenomenon that occurs in a metal circuit while the circuit is in operation, as opposed to a failure occurring during fabrication. Electromigration is caused by the diffusion of the metal in the electric field set up in the circuit. The metal gets transported from one end to the other after hours of operation and eventually separates completely, causing an opening in the circuit. This problem is sometimes overcome by Cu doping and texture improvement. However, electromigration is a problem that gets worse as the current density increases.

Copper and its alloys, on the other hand, have even lower resistivities than aluminum and significantly higher electromigration resistance. These characteristics are important for supporting the higher current densities experienced at high levels of integration and increase device speed. However, the primary problems with integrating copper metal into multilevel metallization systems are (1) the difficulty of patterning the metal using etching techniques, and (2) the difficulty in filling small vias using PVD given the lack of mature CVD processes. For devices of submicron minimum feature size, wet etch techniques for copper patterning have not been acceptable due to liquid surface tension, isotropic etch profile, and difficulty in over-etch control and a reliable dry etch process is not available.

Several methods have been proposed for producing patterned copper interconnects, including selective electroless plating, selective chemical vapor deposition, high temperature reactive ion etching and lift off processing. Electroless plating requires that the floor of an interconnect be seeded to make the floor conductive. The conductive floor can then be charged to attract copper from a solution or bath.

Selective chemical vapor deposition typically involves the decomposition of a metal precursor gas on an electrically conducting surface. However, a reliable and mature process for selective CVD copper is not available.

High temperature reactive ion etching (RIE), or sputter etching, has also been used to pattern a copper layer. Furthermore, the RIE can be used in conjunction with lift off processing in which excess metal is lifted off the structure by a release layer to leave a planar surface having a copper feature formed therein.

Yet another technique for metal wiring of copper comprises the patterning and etching of a trench and/or contact within a thick layer of insulating material, such as $SiO_2$. Thereafter, a thin layer of a barrier metal, such as Ti, TiW or TiN, may be provided on top of the insulating layer and within the trench and/or contact to act as a diffusion barrier to prevent inter-diffusion of the metal to be subsequently deposited into the silicon, and between such metal and oxide. After barrier metal deposition, a layer of copper is deposited to completely fill the trench.

A known metallization technique provides a method for forming a dual damascene interconnect in a dielectric layer having dual damascene via and wire definitions, wherein the via has a floor exposing an underlying layer. The method includes physical vapor deposition of a barrier layer, physical vapor deposition of a conductive metal, preferably copper, and then electroplating of the conductive metal to fill the vias and trenches. Finally, the deposited layers and the dielectric layers are planarized, such as by chemical mechanical polishing, to define a conductive wire.

Referring to FIGS. 1A through 1E, a cross-sectional diagram of a layered structure 10 is shown including a dielectric layer 16 formed over an underlying layer 14 which contains electrically conducting features 15. The underlying layer 14 may take the form of a doped silicon substrate or it may be a first or subsequent conducting layer formed on a substrate. The dielectric layer 16 is formed over the underlying layer 14 in accordance with procedures known in the art to form a part of the overall integrated circuit. Once deposited, the dielectric layer 16 is etched to form a dual damascene via and wire definition, wherein the via has a floor 30 exposing a small portion of the conducting feature 15. Etching of the dielectric layer 16 is accomplished with any dielectric etching process, including plasma etching. Specific techniques for etching silicon dioxide and organic materials may include such compounds as buffered hydrofluoric acid and acetone or EKC, respectively. However, patterning may be accomplished using any method known in the art.

Figure 1A:
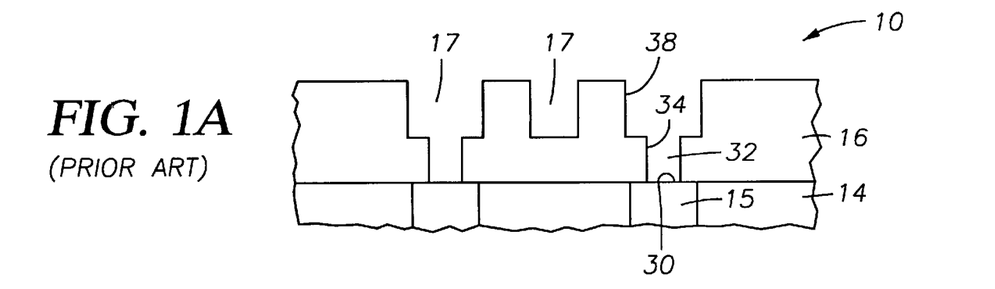
FIGS. 1A, 1B, 1C, 1D and 1E (Prior Art) show a dual damascene via and wire definition and prior art steps for providing a metal interconnect using a barrier layer, PVD metal deposition and metal electroplating.

Referring to FIG. 1A, a cross-sectional diagram of a dual damascene via and wire definition formed in the dielectric layer 16 is shown. The via and wire definition facilitates the deposition of a conductive interconnect that will provide an electrical connection with the underlying conductive feature 15. The definition provides vias 32 having via walls 34 and a floor 30 exposing at least a portion of the conductive feature 15, and trenches 17 having trench walls 38.

Figure 1B:
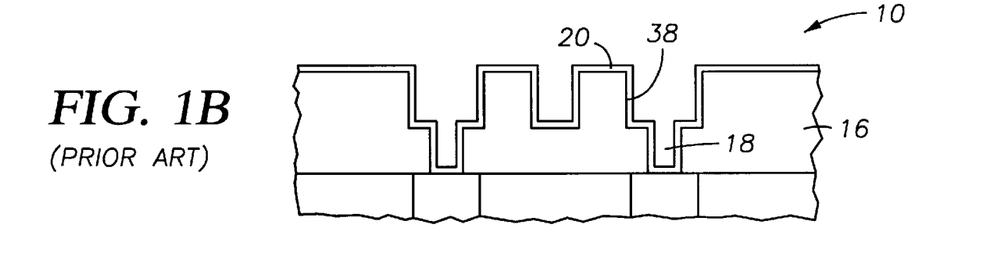

Referring to FIG. 1B, a barrier layer 20 of PVD TaN is deposited on the via and wire definition leaving holes 18 in the vias 32. The barrier layer is preferably formed of titanium, titanium nitride, tantalum or tantalum nitride. The process used may be PVD, CVD, or combined CVD/PVD for texture and film property improvement. The barrier layer limits the diffusion of copper and dramatically increases the reliability of the interconnect. It is preferred that the barrier layer having a thickness between about 25 and about 400 Angstroms (Å), most preferably about 100 Å.

Figure 1C:
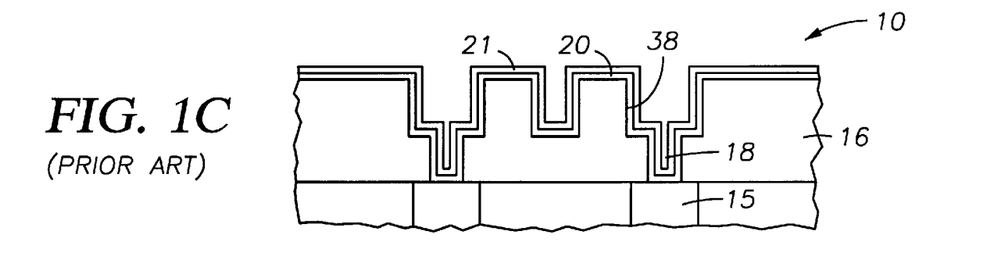

Referring to FIG. 1C, a PVD copper layer 21 is deposited on the barrier layer 20 over the walls 34, 38 and floor 30 of the wire definition. The metal used could also be aluminum or tungsten. The PVD copper layer 21 provides good adhesion for additional metal layers.

Figure 1D:
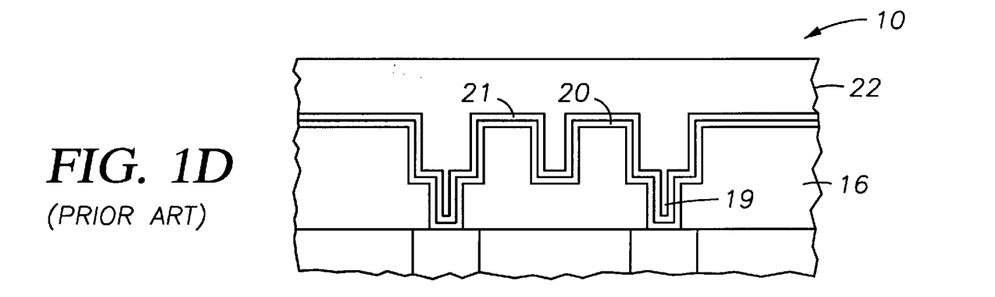

Referring to FIG. 1D, copper 22 is electroplated over the PVD copper layer 21 to fill the via 32 with a copper plug 19. Electroplating is well known in the art and can be achieved by a variety of techniques.

Figure 1E:
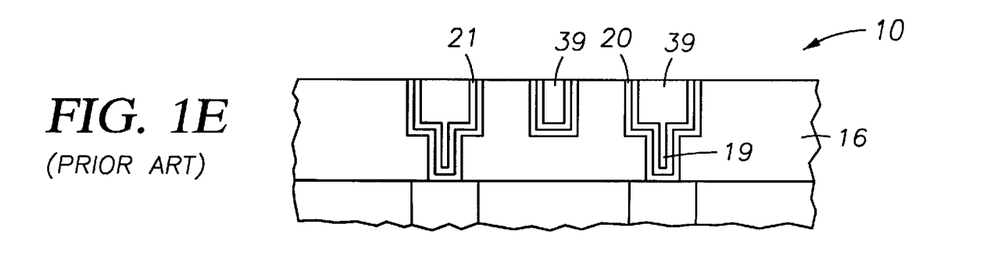

Referring to FIG. 1E, the top portion of the structure 10 is then planarized, preferably by chemical mechanical polishing (CMP). During the planarization process, portions of the copper layers 21, 22, barrier layer 20, and dielectric 16 are removed from the top of the structure leaving a fully planar surface with conductive wires 39 formed in the trenches therein.

In comparison to PVD copper deposition, thin films deposited during a blanket CVD process are usually conformal and provide excellent step coverage, i.e., uniform thickness of layers on the sides and base of any aperture formed on the substrate, even for very small aperture geometries. Therefore, blanket CVD is a common method used to fill apertures. However, there are two primary difficulties associated with blanket CVD processes. First, blanket CVD films grow from all sides in an aperture which typically results in a void in the filled aperture because the deposited layer grows upwardly and outwardly at the upper corners of the aperture and bridges at the upper surface of the aperture before the aperture has been completely filled (i.e., bridging or crowning). Also, a continuous nucleation layer, i.e., a continuous film layer to insure nucleation over all surfaces of the substrate, which is deposited on the aperture walls to ensure deposition of the CVD layer thereon, further reduces the width of the aperture, thereby increasing the difficulty of filling of the aperture without voids. Second, films deposited by blanket CVD tend to conform to the topography of the surface on which the films are deposited which may result in a film having a randomly oriented crystal structure and resulting lower reflectivity properties and poor electromigration performance if the topography is non-oriented or random.

Selective CVD is based on the fact that the decomposition of the CVD precursor gas to provide a deposition film usually requires a source of electrons from a conductive nucleation film. In accordance with a conventional selective CVD process, deposition should occur in the bottom of an aperture where either a conducting film or doped silicon from the underlying layer has been exposed, but should not grow on the insulative field or insulative aperture walls where no nucleation sites are provided. These conducting films and/or doped silicon exposed at the base of the apertures, unlike dielectric surfaces, supply the electrons needed for decomposition of the precursor gas and resulting deposition of the film layer. The result obtained through selective deposition is a "bottom-up" growth of the film in the apertures capable of filling very small dimension (<0.25 $\mu$m), high aspect ratio (>5:1) vias or contacts. However, in selective CVD processes unwanted nodules form on the field where defects in that surface exist.

PVD processes, on the other hand, enable deposition of highly oriented films having improved reflectivity, but do not provide good aperture filling or step coverage in high aspect ratio applications. Physical sputtering of target material results in particles traveling at acute angles relative to the substrate surface. As a result, where high aspect ratio apertures are being filled, sputtered particles tend to deposit on the upper wall surfaces and cover the opening thereof before the aperture is completely filled with deposition material. The resulting structure typically includes voids therein which compromise the integrity of the devices formed on the substrate.

High aspect ratio apertures can be filled using PVD processes by depositing the film at elevated temperatures. As an example, aluminum can be deposited at 400° C. or higher to enhance flow of the aluminum on the surface and throughout the aperture. It has been found that this hot Al process provides improved step coverage. However, hot Al process have been shown to have unreliable via fill, high deposition temperatures and long fill times, and poor film reflectivity.

Despite the availability of these techniques, there remains a need for a metallization process for fabricating dual damascene interconnects and vias having floors of any deposition material. Such highly integrated interconnects must provide void-free vias, particularly in high aspect ratio, sub-quarter micron wide apertures for forming contacts and vias. Furthermore, there is a need for a process providing a circuit with higher electrical conductivity and improved electromigration resistance. It would be desirable to have a simple process requiring fewer processing steps to form metal plugs in the vias and wires in the trenches. It would be further desirable if the process could achieve all this without the use of metal etch techniques.

SUMMARY OF THE INVENTION

The present invention provides a method for forming a dual damascene interconnect in a nonconducting layer having dual damascene via and wire definitions. The method includes depositing a barrier layer on exposed surfaces of the non-conducting layer including the surfaces within the dual damascene via and wire definition. The via and wire definition is then filled with a conductive metal, such as copper or aluminum, using two or more deposition techniques which are preferably separated by an annealing step to prevent voids. Finally, the conductive metal, the barrier layer, and the dielectric layers are planarized, such as by chemical mechanical polishing, to define a conductive wire which is connected by a via to a lower conducting region.

BRIEF DESCRIPTION OF THE DRAWINGS

So that the maimer in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The present invention generally provides an in-situ metallization process providing an interconnect in a highly integrated structure which has a reduced interconnect resistance and improved electromigration performance. More particularly, the present invention provides a dual damascene interconnect that incorporates a barrier layer on exposed surfaces of a via and wire definition and two or more deposition techniques to fill the via and wire definition. Preferred deposition techniques can be combined in an integrated processing system, although non-integrated techniques will provide suitable metal interconnects and metal via plugs.

For clarity, the present invention will be described below with reference to copper deposition techniques. However, other metal processes, such as PVD aluminum or Al/Cu, may be used to accomplish the advantages of the present invention.

Figure 2A:
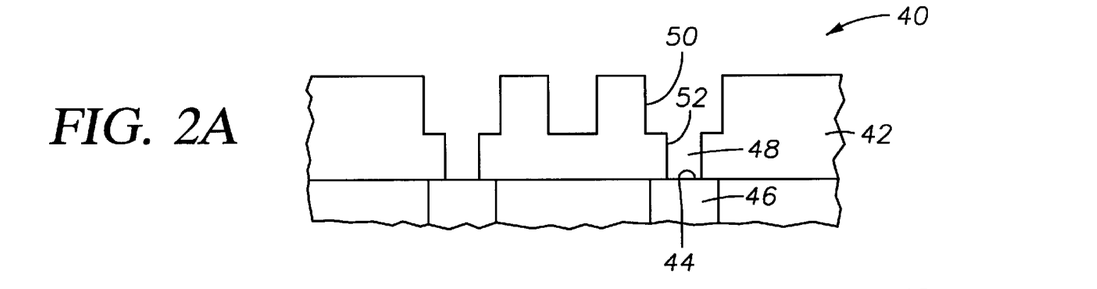
FIGS. 2A, 2B, 2C, 2D, and 2E show a dual damascene via and wire definition and deposition of a barrier layer prior to filling the via and wire definition with a conductive metal in accordance with a first embodiment of the present invention.

Referring to FIG. 2A, to form an IC structure 40 in accordance with the present invention, a dielectric layer 42 is formed by conventional techniques over a surface 44 of a conducting layer or conducting region 46 of a patterned layer. The dielectric layer may be as thick as about twice the thickness of a single metallization layer since a dual damascene via and wire definition will be etched therethrough. Any dielectric material, whether presently known or yet to be discovered, may be used and is within the scope of the present invention, including low dielectric materials such as carbon fluorinated $SiO_2$, organic polymers, etc. The dielectric layer may be deposited on any suitable deposition enhancing material, but the preferred deposition enhancing materials include conductive metals and doped silicon.

Once deposited, the dielectric layer is etched to form a dual damascene via and wire definition, wherein the via 48 connects the lower conducting region 46 to a trench 50 which forms a wire or interconnect when filled. The via will typically have a high aspect ratio with steep sidewalls 52. Etching of the dielectric layer 42 may be accomplished with any dielectric etching process, including plasma etching. Specific techniques for etching silicon dioxide and organic materials may include such compounds as buffered hydrofluoric acid and acetone or EKC, respectively. However, patterning may be accomplished using any method known in the art.

Figure 2B:
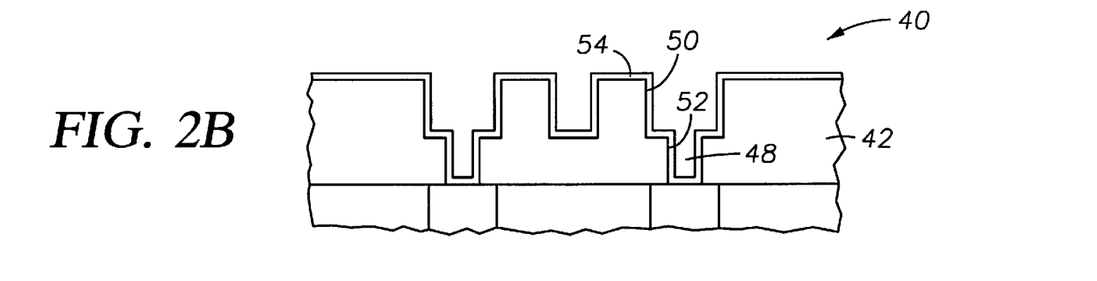

Referring to FIG. 2B, a barrier layer 54 is deposited on exposed surfaces including surfaces within the via 48 and wire 50 definitions. According to the present invention, preferred barrier/wetting layers include such layers as a refractory (such as tungsten (W), tungsten nitride (WN), niobium (Nb), aluminum silicates, etc.), tantalum (Ta), tantalum nitride (TaN), titanium nitride (TiN), PVD Ti/$N_2$-stuffed, a ternary compound (such as TiSiN, WSiN, etc.) or a combination of these layers. Preferred barrier materials include titanium, titanium nitride, titanium silicon nitride, tungsten nitride, tungsten silicon nitride, tantalum, tantalum nitride, tantalum silicon nitride, doped silicon, aluminum, and aluminum oxides. The most preferred barrier/wetting materials are Ta and TaN which typically are provided as a PVD layer having a thickness between about 50 and about 1000 Å. Conversely, a CVD TiN or WN barrier/wetting layer will typically have a thickness between about 100 and about 400 Å. The barrier/wetting layer is deposited to form a substantially continuous cap over the dielectric layer and may be treated with nitrogen. Alternatively, exposed surfaces of silicon oxide can be treated with nitrogen to form a $Si_xO_yN_z$ layer that is effective as a barrier layer for copper.

A combination of barrier/wetting layers can be produced by altering process gas flows to provide better adhesion to CVD Cu. For example, CVD deposition of WN by reaction of $WF_6$, $N_2$, $H_2$, and $SiH_4$ provides excellent adhesion to the dielectric layer. Shutting off the nitrogen flow during deposition results in a final barrier/wetting layer of CVD W which adheres to the CVD WN layer and the subsequent CVD Cu layer. Similarly, a TaN layer can be combined with a Ta layer or a TiN layer can be combined with a Ti layer by shutting off nitrogen flow. The combined layers improve adhesion to CVD Cu which provides better texture to the material deposited in the via or trench. Alternatively, WN, TaN, or TiN barrier/wetting layers can be pre-treated with $H_2$, Ar, or He plasma to nucleate the CVD Cu layer and provide better adhesion.

CVD/PVD Fill

Figure 2C:
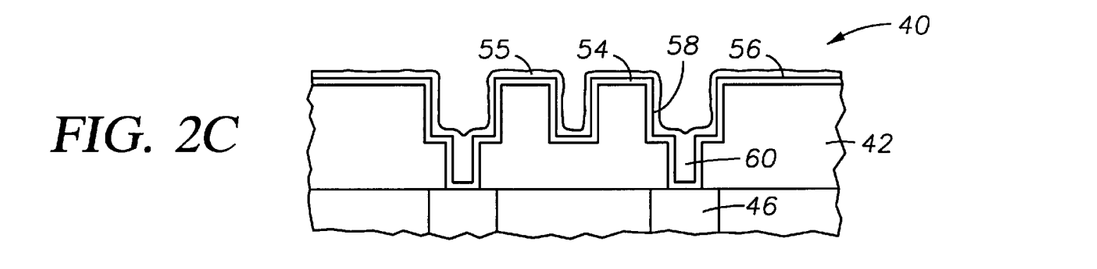
Figure 2D:
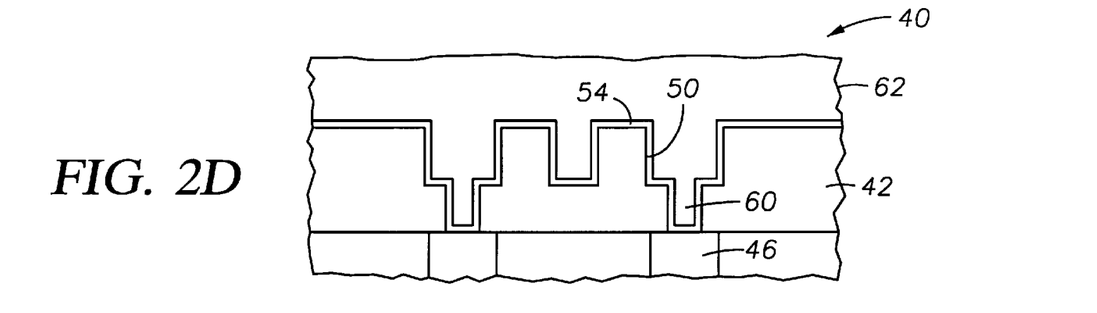
Figure 2E:
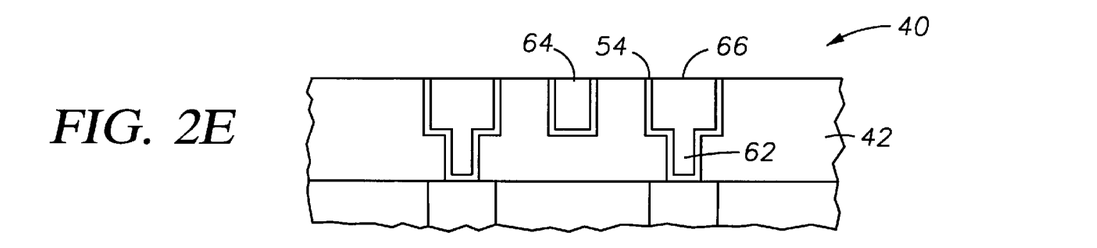

In one embodiment 40 of the invention, as further shown in FIGS. 2C–2E, a method is provided for forming dual damascene plugs and interconnects having lower resistivity and greater electromigration resistance. The sub-half micron via is filled without voids by conformal CVD Cu and the trench is then filled with PVD Cu which preferably includes tin as a dopant. After deposition, the dopant migrates into the CVD Cu layer to improve electromigration resistance. The wires are completed by planarizing the structure.

Referring to FIG. 2C, a cross-sectional diagram of the dual damascene via and wire definition having the conformal barrier layer 54, includes a conformal CVD Cu layer 55 which is uniformly deposited on field regions 56 and sidewalls 58 until the via is completely filled by a copper plug 60.

Referring to FIG. 2D, a copper layer 62 is physical vapor deposited over the CVD Cu layer to fill the wire definition 50. In order to fill the wire definition, it will generally occur that the entire field of the structure will become covered with the PVD Cu.

Referring to FIG. 2E, the top portion of the structure 40 is then planarized, preferably by chemical mechanical polishing (CMP)(such as a Mirra® System available from Applied Materials, Santa Clara, Calif.). During the planarization process, portions of the copper 62, barrier material 54, and dielectric 42 are removed from the top of the structure leaving a fully planar surface with conductive wires 64, 66 formed therein.

CVD/Anneal/PVD Fill

In another embodiment 70 of the invention, as shown in FIGS. 3A–3E, the sub-half micron via is partially filled by the conformal CVD Cu and then annealed to fill the via. The trench is then filled with PVD Cu as previously described. If a trench has a small width, the annealing step may also fill the trench. Trenches may have the same width as the via which connects the trench to an underlying layer. The PVD Cu step may still be used to provide dopants or to provide sufficient film thickness for planarizing the structure.

Figure 3A:
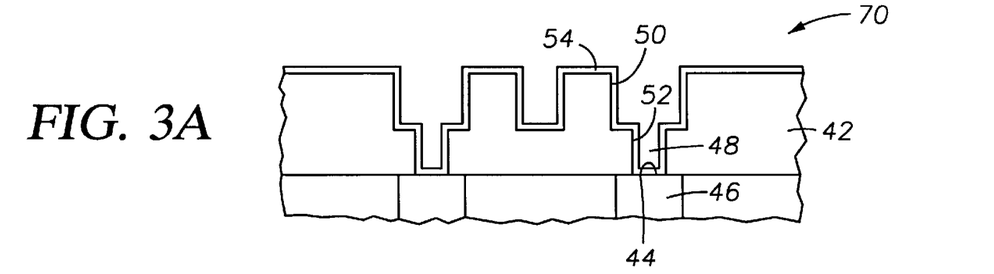
FIGS. 3A, 3B, 3C, 3D, and 3E show a dual damascene via and wire definition having a barrier layer and steps for deposition of a conductive metal in accordance with a second embodiment of the invention.
Figure 3B:
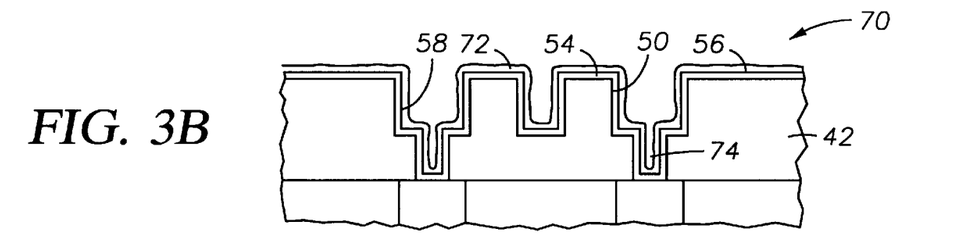
Figure 3C:
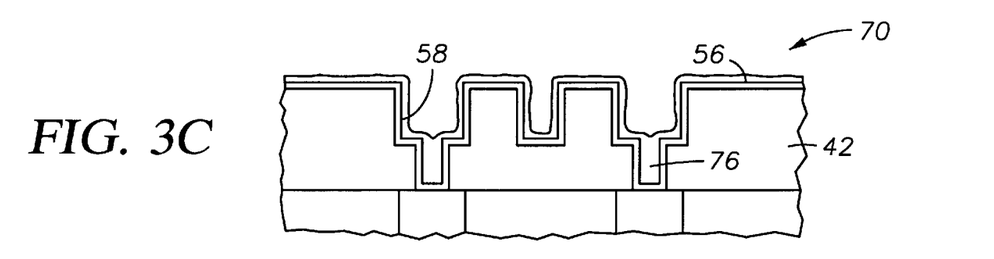

FIG. 3A shows a patterned dielectric having a barrier layer 54 formed thereon similar to that shown in FIG. 2B. Referring to FIG. 3B, a cross-sectional diagram of the dual damascene via and wire definition having the conformal barrier layer 54, includes a conformal CVD Cu layer 72 which is uniformly deposited on field regions 56 and sidewalls 58 until the via is partially filled leaving a hole 74. Referring to FIG. 3C, the CVD Cu layer is then annealed by heating the wafer to a temperature from about 300° C. to about 450° C. to reflow the copper into the hole 74 and form a copper plug 76.

Figure 3D:
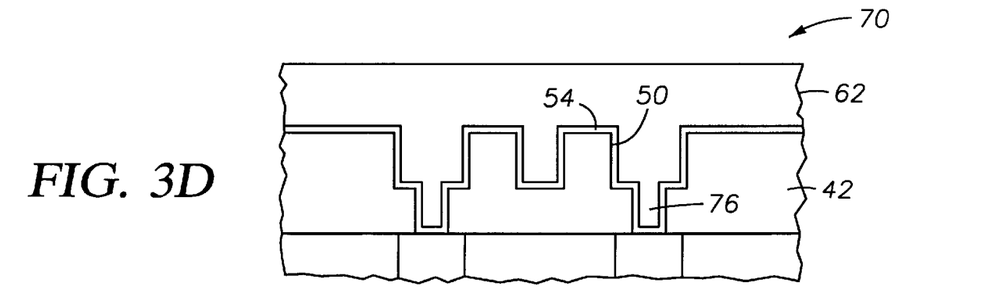

Referring to FIG. 3D, a copper layer 62 is physical vapor deposited over the CVD Cu layer to fill the wire definition 50. In order to fill the wire definition, it will generally occur that the entire field of the structure will become covered with the PVD Cu.

Figure 3E:
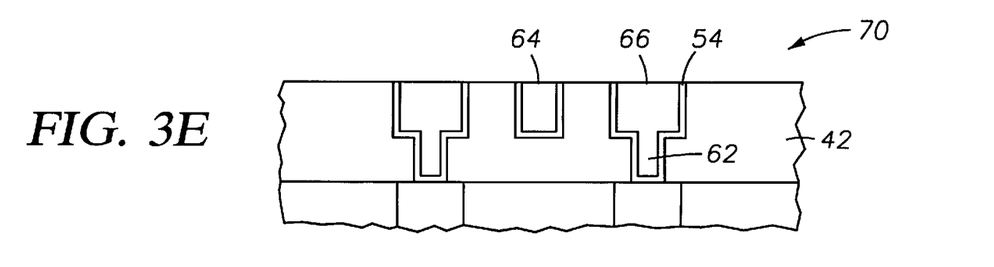

Referring to FIG. 3E, the top portion of the structure 70 is then planarized, preferably by chemical mechanical polishing (CMP). During the planarization process, portions of the copper 62, barrier material 54, and dielectric 42 are removed from the top of the structure leaving a fully planar surface with conductive wires 64, 66 formed therein.

Electroplating/PVD or CVD/PVD Fill

In another embodiment 80 of the invention as shown in FIGS. 4A–4E, the sub-half micron via is partially or totally filled by Cu electroplating or by conformal CVD Cu. The trench can then be filled in a non-integrated system with PVD Cu as previously described. When following Cu electroplating, the PVD Cu is preferably doped to improve electromigration. The wires are completed by planarizing the structure.

Figure 4A:
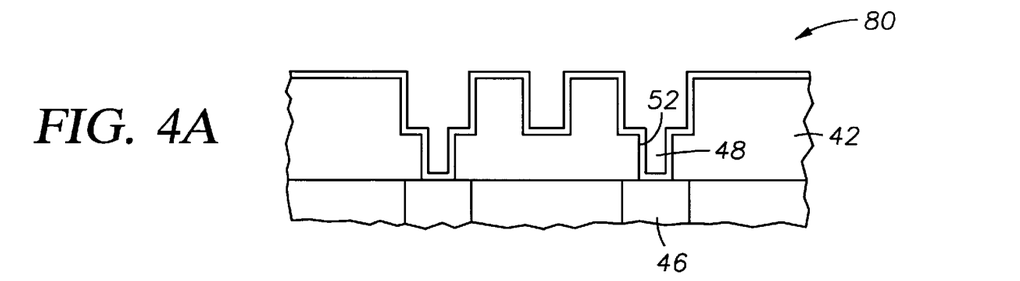
FIGS. 4A, 4B, 4C, 4D, and 4E show a dual damascene via and wire definition having a barrier layer and steps for deposition of a conductive metal in accordance with a third embodiment of the present invention.
Figure 4B:
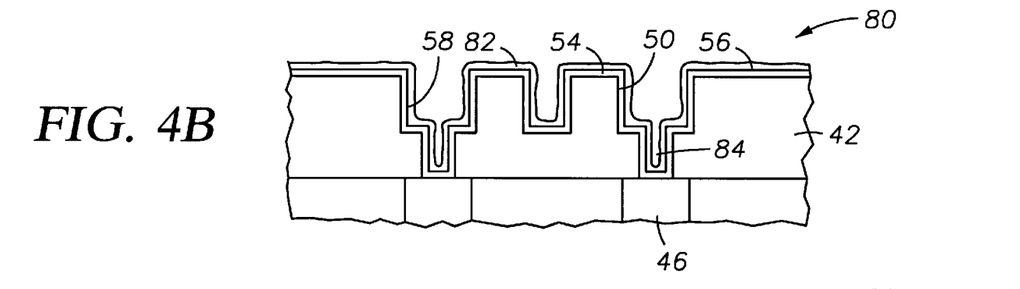
Figure 4C:
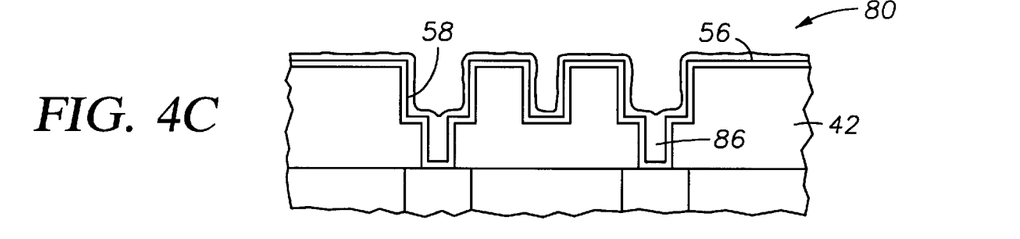

FIG. 4A shows a patterned dielectric having a barrier layer 54 formed thereon similar to that shown in FIG. 2B. Referring to FIG. 4B, a cross-sectional diagram of the dual damascene via and wire definition having the conformal barrier layer 54, includes a conformal Cu electroplating layer 82 which is uniformly deposited on field regions 56 and sidewalls 58 until the via is partially filled leaving a hole 84. Referring to FIG. 4C, the Cu electroplating layer is then annealed by heating the wafer to a temperature from about 300° C. to about 450° C. to reflow the copper into the hole 84 and form a copper plug 86.

Figure 4D:
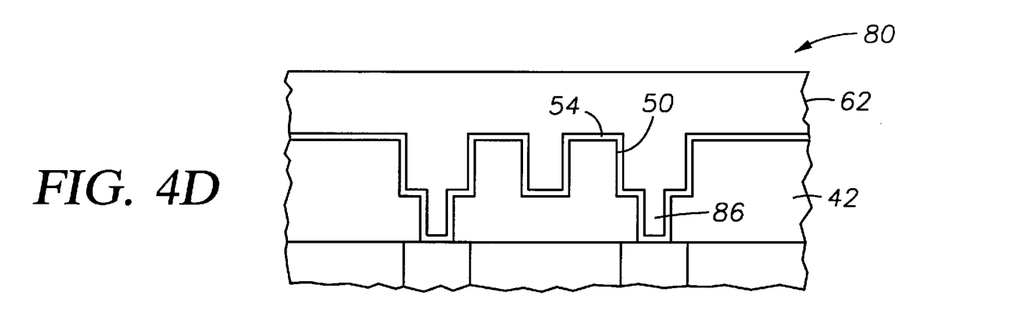

Referring to FIG. 4D, a copper layer 62 is physical vapor deposited over the Cu electroplating layer to fill the wire definition 50. In order to fill the wire definition, it will generally occur that the entire field of the structure will become covered with the PVD Cu.

Figure 4E:
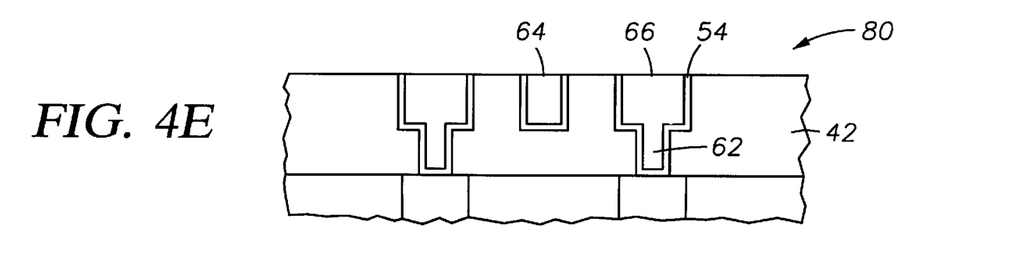

Referring to FIG. 4E, the top portion of the structure 80 is then planarized, preferably by chemical mechanical polishing (CMP). During the planarization process, portions of the copper 62, barrier material 54, and dielectric 42 are removed from the top of the structure leaving a fully planar surface with conductive wires 64, 66 formed therein.

CVD/Anneal/Electroplating

In another embodiment 90 of the invention as shown in FIGS. 5A–5E, the sub-half micron via is partially filled by conformal CVD Cu and then annealed by heating the wafer to a temperature from about 300° C. to about 400° C. to smooth the surfaces of the copper layer. The via and trench can then be filled in a non-integrated system with Cu electroplating.

Figure 5A:
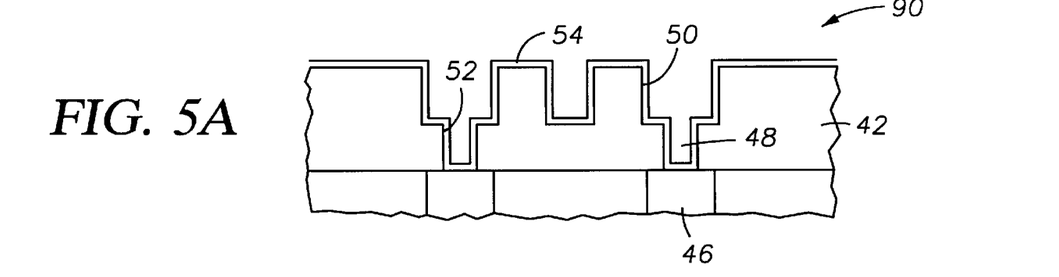
FIGS. 5A, 5B, 5C, 5D, and 5E show a dual damascene via and wire definition having a barrier layer and steps for deposition of a conductive metal in accordance with a fourth embodiment of the present invention.
Figure 5B:
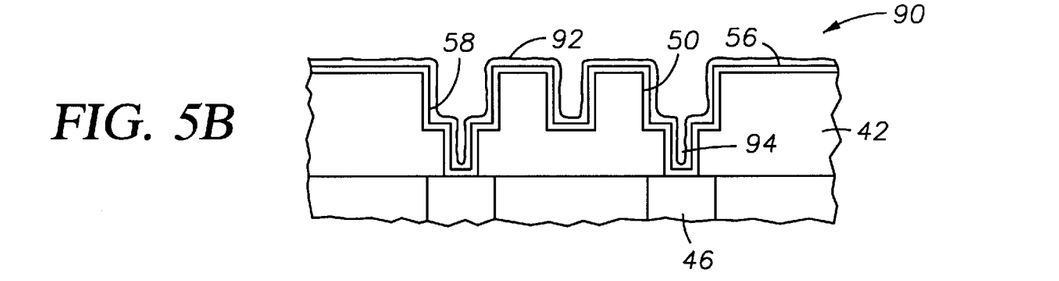
Figure 5C:
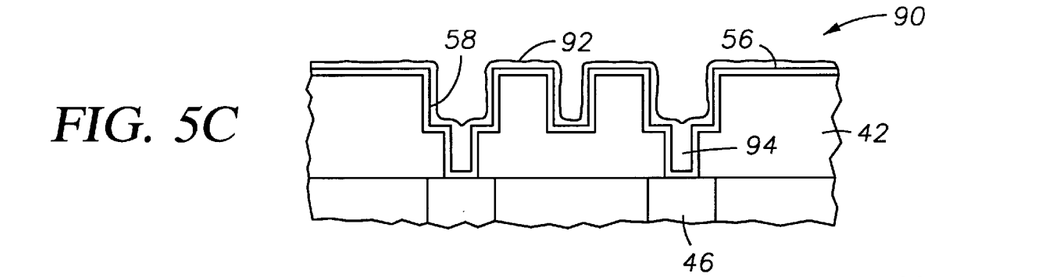

FIG. 5A shows a patterned dielectric having a barrier layer 54 formed thereon similar to that shown in FIG. 2B. Referring to FIG. 5B, a cross-sectional diagram of the dual damascene via and wire definition having the conformal barrier layer 54, includes a conformal CVD Cu layer 92 which is uniformly deposited on field regions 56 and sidewalls 58 until the via is partially filled leaving a hole 94. Referring to FIG. 5C, the CVD Cu layer 92 is then annealed to smooth the copper layer without filling the hole 94.

Figure 5D:
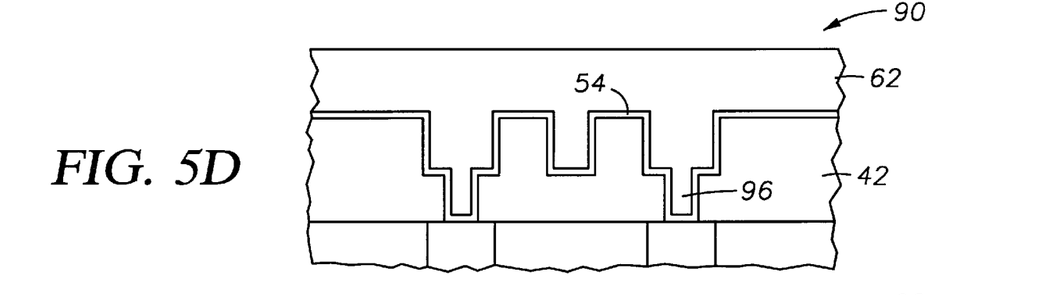

Referring to FIG. 5D, a copper layer 62 is deposited by electroplating to fill the via and wire definition forming a copper plug 96. In order to fill the wire definition, it will generally occur that the entire field of the structure will become covered with the copper.

Figure 5E:
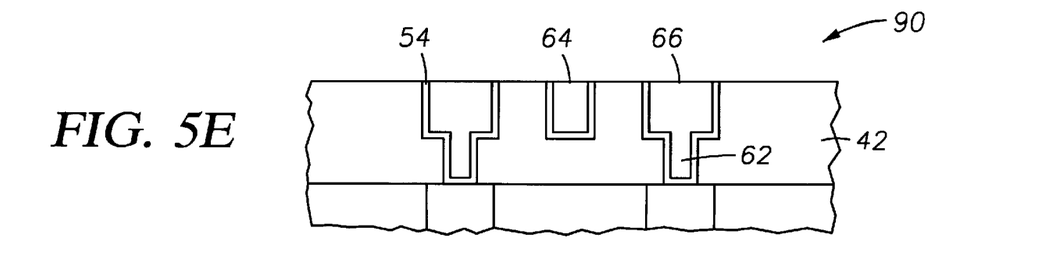

Referring to FIG. 5E, the top portion of the structure 90 is then planarized, preferably by chemical mechanical polishing (CMP). During the planarization process, portions of the copper 62, barrier material 54, and dielectric 42 are removed from the top of the structure leaving a fully planar surface with conductive wires 64, 66 formed therein.

CVD/Anneal/CVD/Anneal Fill

In another embodiment 100 of the invention, as shown in FIGS. 6A–6E, the sub-half micron via is partially filled by conformal CVD Cu and then annealed to fill the via. The trench is then filled with CVD Cu and then annealing as described for the via. Wires are formed by planarizing the structure.

Figure 6A:
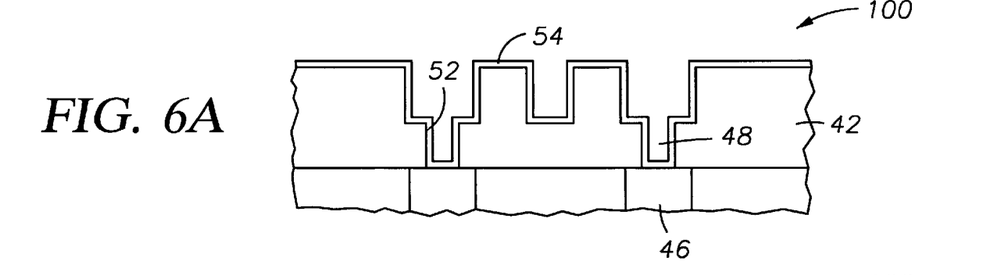
FIGS. 6A, 6B, 6C, 6D, and 6E show a dual damascene via and wire definition having a barrier layer and steps for deposition of a conductive metal in accordance with a fifth embodiment of the present invention.
Figure 6B:
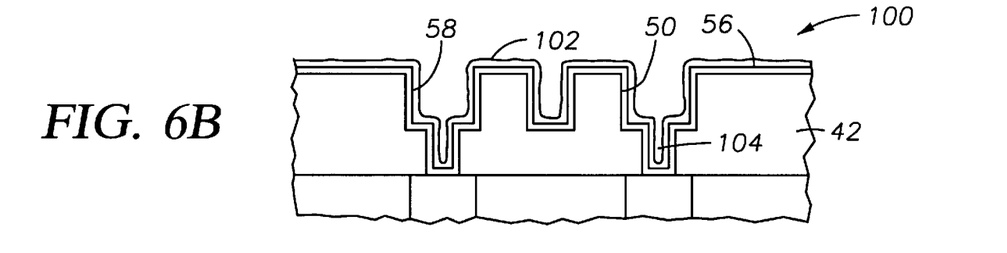
Figure 6C:
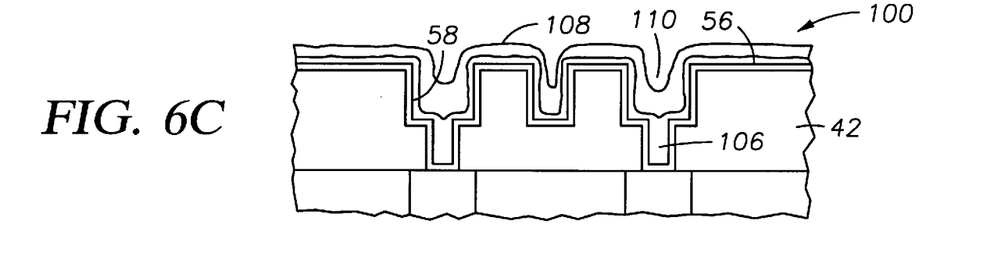
Figure 6D:
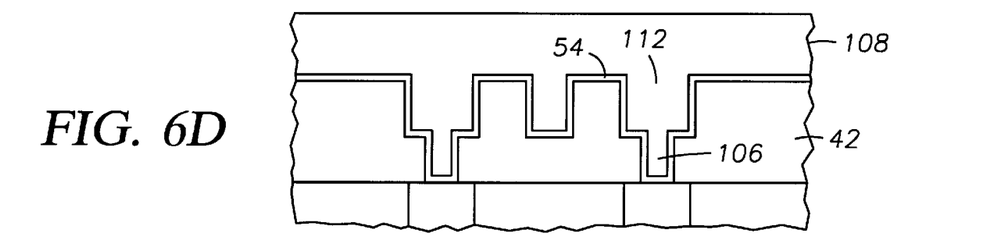
Figure 6E:
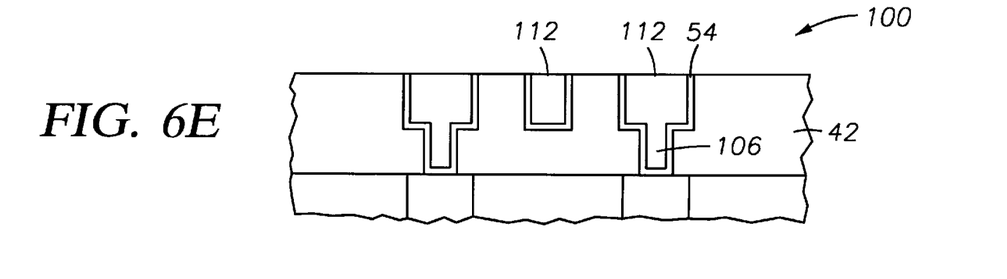

FIG. 6A shows a patterned dielectric having a barrier layer 54 formed thereon similar to that shown in FIG. 2B. Referring to FIG. 6B, a cross-sectional diagram of the dual damascene via and wire definition having the conformal barrier layer 54, includes a conformal CVD Cu layer 102 which is uniformly deposited on field regions 56 and sidewalls 58 until the via is partially filled leaving a hole 104. Referring to FIG. 6C, the CVD Cu layer is then annealed by heating the wafer to a temperature from about 300° C. to about 450° C. to reflow the copper into the hole 104 and form a copper plug 106. A second conformal CVD Cu layer 108 is then uniformly deposited on the annealed CVD layer until the trenches are partially filled leaving a hole 110. Referring to FIG. 6D, the second CVD Cu layer 108 is then annealed by heating the wafer to a temperature from about 300° C. to about 450° C. to reflow the copper into the trench hole 110 and form a copper wire 112. Referring to FIG. 6E, the copper wires 112 are completed by planarization as previously described.

Integrated Processing System

Figure 7:
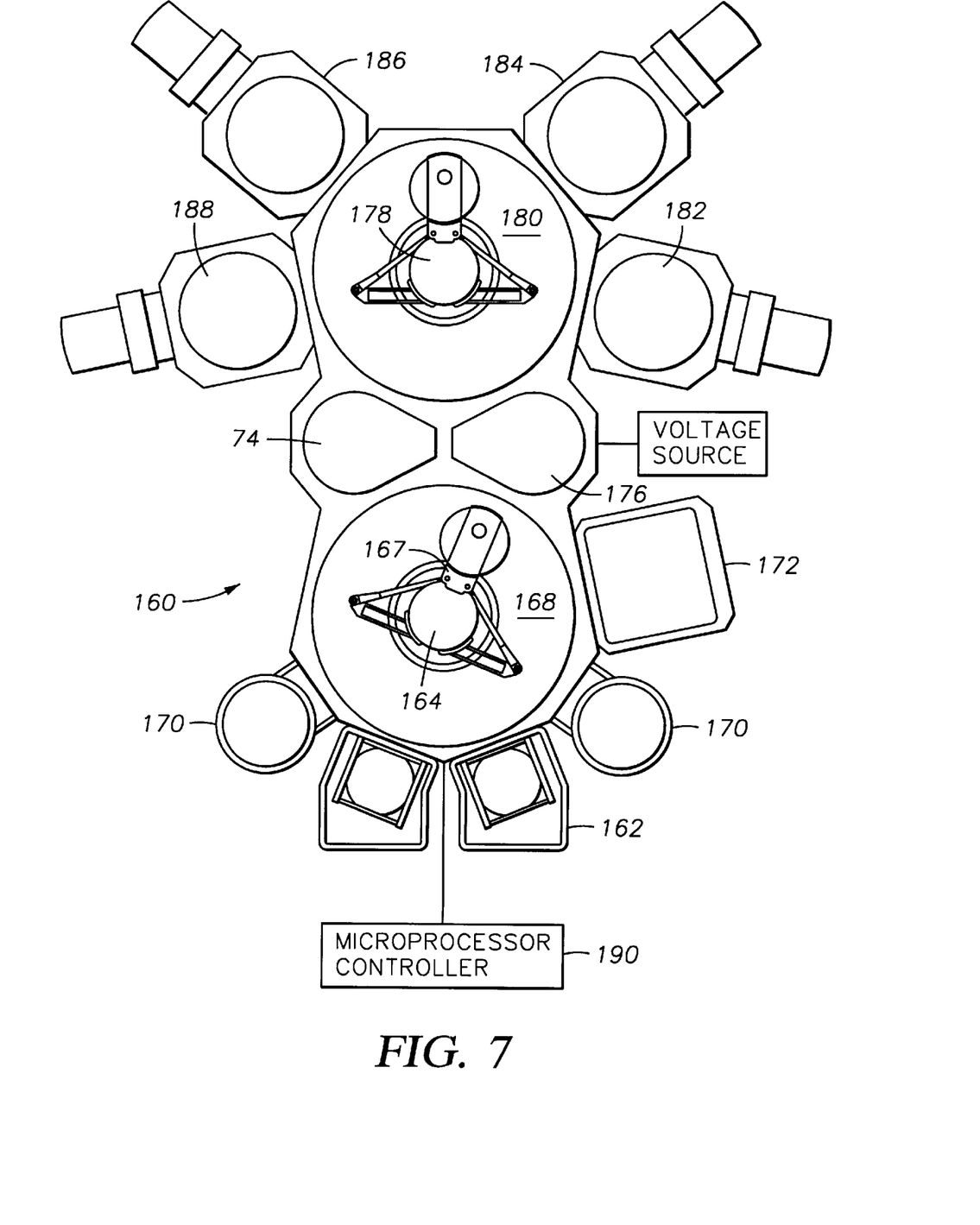
FIG. 7 is an integrated processing system configured for sequential metallization in accordance with preferred embodiments of the present invention.

Referring now to FIG. 7, a schematic diagram of an integrated processing system 160 having both PVD and

CVD chambers thereon in which the above described integrated processes can be implemented is shown. Typically, substrates are introduced and withdrawn from the processing system 160 through a cassette loadlock 162. A robot 164 having a blade 167 is located within the processing system 160 to move the substrates through the system 160. One robot 164 is typically positioned in a buffer chamber 168 to transfer substrates between the cassette loadlock 162, degas wafer orientation chamber 170, preclean chamber 172, PVD TiN chamber 174 and cooldown chamber 176. A second robot 178 is located in transfer chamber 180 to transfer substrates to and from the cooldown chamber 176, coherent Ti chamber 182, CVD TiN chamber 184, CVD Cu chamber 186 and PVD IMP Cu processing chamber 188. The transfer chamber 180 in the integrated system is preferably maintained at low pressure or high vacuum in the range of $10^{-3}$ to $10^{-4}$ torr. This specific configuration of the chambers in FIG. 6 comprise an integrated processing system capable of both CVD and PVD processes in a single cluster tool. This particular chamber configuration or arrangement is merely illustrative and more configurations of PVD and CVD processes are contemplated by the present invention.

Typically, a substrate processed in the processing system 160 is passed from the cassette loadlock 162 to the buffer chamber 168 where the robot 164 first moves the substrate into a degas chamber 170. The substrate is then be transferred into preclean chamber 172, PVD TiN chamber 174, and then into a cooldown chamber 176. From the cooldown chamber 176, the robot 178 typically moves the substrate into and between one or more processing chambers before returning the substrate back to the cooldown chamber 176. It is anticipated that the substrate may be processed or cooled in one or more chambers any number of times in any order to accomplish fabrication of a desired structure on the substrate. The substrate is removed from the processing system 160, following processing, through the buffer chamber 168 and then to the loadlock 162. A microprocessor controller 190 controls the sequence and formation of the layers on the substrates.

In accordance with the present invention, the processing system 160 passes a substrate through loadlock 162 into de-gas chamber 170 wherein the substrate is introduced to outgas contaminants. A substrate is then moved into a pre-clean chamber 172 where the surface of the substrate is cleaned to remove any contaminants thereon. The substrate is then processed in a CVD-TiN chamber 175 to deposit a barrier layer on the dielectric layer. The robot 178 then transfers the substrate to a CVD Cu 174. The substrate receives two or more layers of the metal to form the metal plug and interconnect. Annealing can occur in any heated chamber. After the metal layer is fully deposited, the substrate is sent to a planarization unit.

A staged-vacuum wafer processing system is disclosed in U.S. Pat. No. 5,186,718, entitled "Staged-Vacuum Wafer Processing System and Method," Tepman et al., issued on Feb. 16, 1993, which is hereby incorporated herein by reference. This system has been modified to accommodate a CVD chamber thereon.

A CVD Cu layer may be deposited using by any known CVD Cu process or precursor gas, including copper$^{+2}$(hfac)$_2$ and Cu$^{+2}$(fod)$_2$ (fod being an abbreviation for heptafluoro dimethyl octanediene), but a preferred process uses the volatile liquid complex copper+1hfac, TMVS (hfac being an abbreviation for the hexafluoro acetylacetonate anion and TMVS being an abbreviation for trimethylvinylsilane) with argon as the carrier gas. Because this complex is a liquid under ambient conditions, it can be utilized in standard CVD bubbler precursor delivery systems currently used in semiconductor fabrication. Both TMVS and copper$^{+2}$(hfac)$_2$ are volatile byproducts of the deposition reaction that are exhausted from the chamber. The deposition reaction is believed to proceed according to the following mechanism, in which (s) denoted interaction with a surface and (g) denotes the gas phase.

2Cu+1hfac, TMVS(g)→2Cu+1hfac, TMVS(s)    step (1)

2Cu$^{+1}$hfac, TMVS(s)→2Cu$^{+1}$hfac(s)+2TMVS(g)    step (2)

2Cu$^{+1}$hfac(s)→Cu(s)+Cu$^{+2}$(hfac)$_2$(g)    step (3)

In step 1, the complex is adsorbed from the gas phase onto a metallic surface. In step 2, the coordinated olefin (TMVS in this specific case) dissociates from the complex as a free gas leaving behind Cu$^{+1}$hfac as an unstable compound. In step 3, the Cu$^{+1}$hfac disassociates to yield copper metal and volatile Cu$^{+2}$(hfac)$_2$. The disassociation at CVD temperatures appears to be most strongly catalyzed by metallic or electrically conducting surfaces. In an alternative reaction, the organometallic copper complex can be reduced by hydrogen to yield metallic copper.

The volatile liquid complex, Cu$^{+1}$hfac,TMVS, can be used to deposit Cu through either a thermal or plasma based process, with the thermal based process being most preferred. The substrate temperature for the plasma enhanced process is preferably between about 100 and about 400° C., while that for the thermal process is between about 50 and about 300° C., most preferably about 170° C. Following either of these processes, a CVD Cu wetting layer may be provided over a nucleation layer. Alternatively, electroplated copper may be used in combination with or in replacement of the CVD Cu wetting layer.

Following deposition of a CVD Cu layer, the substrate is then sent to a PVD Cu chamber to deposit PVD Cu below the melting point temperature of the CVD Cu and PVD Cu. Where the soft metal is copper, it is preferred that the PVD Cu be deposited at a wafer temperature below about 550° C., preferably below about 400° C. The copper layers start to flow during the PVD deposition process at above 200° C., with the tantalum barrier/wetting layer remaining firmly in place as a solid metal layer. Because tantalum has good wetting with copper, the CVD Cu is prevented from dewetting the tantalum at about 400° C. and, therefore, wafer temperatures above the melting point of aluminum (>660° C.), as taught by the prior art CVD process, are not required. Therefore, the application of a thin tantalum layer enables planarization of the copper to be achieved at temperatures far below the melting point of the copper.

For each aspect of the invention, deposited Cu layers may be annealed with H$_2$ to make the layer more resistant to formation of CuO.

Copper electroplating is much less costly than PVD or CVD processes, but can not be performed in the integrated processing system. Fortunately, exposure of the substrate to air when transferring between different process equipment has not formed a noticeable interface in the metal layer. Targets of copper containing from about 0.5 wt % to about 2 wt % Sn can be vapor deposited, or electroplated using a dual e-gun system, under a vacuum of 10$^{-7}$ Torr and a substrate temperature of 150° C.

While the foregoing is directed to the preferred embodiment of the present invention, other and further embodiments of the invention may be devised without departing from the basic scope thereof. The scope of the invention is determined by the claims which follow.

What is claimed is:

1. A method of forming a dual damascene interconnect in a dielectric layer having a dual damascene via and wire definition, comprising:
   a) depositing a barrier layer on exposed surfaces of the dielectric layer;
   b) depositing a conductive material on the barrier layer, annealing the conductive material, and depositing the conductive material on the annealed conductive material to fill the damascene via and wire definition; and
   c) planarizing the conductive material and the barrier layer.

2. The method of claim 1, wherein the conductive material comprises copper or doped copper.

3. The method of claim 1, wherein the conductive material is selected from the group consisting of copper, aluminum, doped copper, doped aluminum, and mixtures thereof.

4. The method of claim 1, wherein the conductive material is annealed after the conductive material is deposited on the annealed conductive material.

5. The method of claim 1, wherein (a) and (b) are performed in an integrated processing system.

6. The method of claim 1, wherein planarizing is performed by chemical mechanical polishing.

7. The method of claim 1, wherein the barrier layer comprises a material selected from the group consisting of titanium, titanium nitride titanium silicon nitride, tungsten nitride, tungsten silicon nitride, tantalum, tantalum nitride, tantalum silicon nitride, doped silicon, aluminum, and aluminum oxides.

8. A method of forming a dual damascene interconnect in a dielectric layer having a dual damascene via and wire definition, comprising:
   a) depositing a barrier layer on exposed surfaces of the dielectric layer;
   b) chemical vapor depositing a conductive material on the barrier layer and annealing the conductive material to fill the via definition; and
   c) physical vapor depositing the conductive material on the annealed conductive material to fill the wire definition; and
   d) planarizing the conductive material, barrier layer, and dielectric layer to define a conductive wire.

9. The method of claim 8, wherein the conductive material is copper or doped copper.

10. The method of claim 8, wherein the conductive material is selected from the group consisting of copper, aluminum, and mixtures thereof.

11. The method of claim 8, wherein (a) through (d) are performed in an integrated processing system.

12. The method of claim 8, wherein the barrier layer comprises a material selected from the group consisting of titanium, titanium nitride, titanium silicon nitride, tungsten nitride, tungsten silicon nitride, tantalum, tantalum nitride, tantalum silicon nitride, doped silicon, aluminum, and aluminum oxides.

13. The method of claim 8, further comprising annealing the conductive metal after the physical vapor deposition.

14. A method of forming a dual damascene interconnect in a dielectric layer having a dual damascene via and wire definition, comprising:
   a) depositing a barrier layer on exposed surfaces of the dielectric layer;
   b) chemical vapor depositing a first conductive material on the barrier layer; then
   c) annealing the first conductive material to fill the via definition; then
   d) physical vapor depositing the second conductive material on the annealed first conductive material to fill the wire definition; and
   e) planarizing the conductive material, barrier layer, and dielectric layers to define a conductive wire.

15. The method of claim 14, wherein the step of planarizing is performed by chemical mechanical polishing.

16. The method of claim 14, wherein the barrier layer comprises a material selected from the group consisting of titanium, titanium nitride, titanium silicon nitride, tungsten nitride, tungsten silicon nitride, tantalum, tantalum nitride, tantalum silicon nitride, doped silicon, aluminum, and aluminum oxides.

17. The method of claim 14, wherein the first conductive material is copper and the second conductive material is doped copper.

18. A method of forming a dual damascene interconnect in a dielectric layer having a dual damascene via and wire definition, comprising:
   a) depositing a barrier layer on exposed surfaces of the dielectric layer;
   b) electroplating a conductive material on the barrier layer to fill the via definition;
   c) physical vapor depositing the conductive material to fill the wire definition, wherein the conductive material deposited by electroplating is annealed prior to the physical vapor deposition; and
   d) planarizing the conductive material and the barrier layer.

19. The method of claim 18, wherein the conductive material deposited by physical vapor deposition comprises dopants.

20. The method of claim 18, wherein the barrier layer comprises a material selected from the group consisting of titanium, titanium nitride, titanium silicon nitride, tungsten nitride, tungsten silicon nitride, tantalum, tantalum nitride, tantalum silicon nitride, doped silicon, aluminum, and aluminum oxides.

21. A method of forming a dual damascene interconnect in a dielectric layer having a dual damascene via and wire definition, comprising:
   a) depositing a barrier layer on exposed surfaces of the dielectric layer;
   b) electroplating a first conductive material on the barrier layer;
   c) annealing the first conductive material;
   d) physical vapor depositing a second conductive material on the annealed conductive material to fill the via and wire definition; and
   e) planarizing the conductive material and barrier layer.

22. The method of claim 21, wherein the second conductive material is copper or doped copper.

23. The method of claim 22, wherein the barrier layer comprises a material selected from the group consisting of titanium, titanium nitride, titanium silicon nitride, tungsten nitride, tungsten silicon nitride, tantalum, tantalum nitride, tantalum silicon nitride, doped silicon, aluminum, and aluminum oxides.

24. A method of forming a dual damascene interconnect in a dielectric layer having a dual damascene via and wire definition, comprising:
- a) depositing a barrier layer on exposed surfaces of the dielectric layer;
- b) chemical vapor depositing a first conductive material on the barrier layer;
- c) annealing the first conductive material to fill the via definition;
- d) chemical vapor depositing a second conductive material on the annealed first conductive material;
- e) annealing the second conductive material to fill the wire definition; and
- f) planarizing the conductive material, barrier layer, and dielectric layers to define a conductive wire.

25. The method of claim 24, wherein the step of planarizing is performed by chemical mechanical polishing.

26. The method of claim 24, wherein the barrier layer comprises a material selected from the group consisting of titanium, titanium nitride, titanium silicon nitride, tungsten nitride, tungsten silicon nitride; tantalum, tantalum nitride, tantalum silicon nitride, doped silicon, aluminum, and aluminum oxides.

* * * * *

UNITED STATES PATENT AND TRADEMARK OFFICE
CERTIFICATE OF CORRECTION

PATENT NO : 5,989,623

DATED : November 23, 1999

INVENTOR(S): Chen et al.

It is certified that error appears in the above-identified patent and that said Letters Patent are hereby corrected as shown below:

In column 3, line 51, after " upper" , please replace " comers" with " corners" .

In column 9, line 17, please replace " $10^{-4}$ " with " $10^{-8}$ " .

In column 10, line 3, please replace " ofthe" with " of the" .

Signed and Sealed this

Third Day of April, 2001

Attest:

NICHOLAS P. GODICI

*Attesting Officer*    *Acting Director of the United States Patent and Trademark Office*